(12) United States Patent
Chiang

(10) Patent No.: US 6,425,482 B1
(45) Date of Patent: Jul. 30, 2002

(54) SCREWDRIVER HANGER

(76) Inventor: Kuo-Chin Chiang, 58, Ma Yuan West St., Taichung (TW)

( * ) Notice: Subject to any disclaimer, the term of this patent is extended or adjusted under 35 U.S.C. 154(b) by 0 days.

(21) Appl. No.: 09/950,351

(22) Filed: Sep. 5, 2001

(51) Int. Cl.[7] .................. B65D 75/56; A45C 11/26
(52) U.S. Cl. .............. 206/349; 206/461; 206/478; 206/486; 206/806
(58) Field of Search ................. 206/349, 372, 206/376, 379, 461, 462, 470, 476, 477, 478, 479–482, 486, 806; 211/70.6

(56) References Cited

U.S. PATENT DOCUMENTS

| | | | | |
|---|---|---|---|---|
| 4,711,352 A | * | 12/1987 | Williams et al. ............ 206/478 |
| 5,044,591 A | * | 9/1991 | Huang ..................... 206/349 |
| 5,484,056 A | * | 1/1996 | Wood ...................... 206/349 |
| 5,713,467 A | * | 2/1998 | Kao ........................ 206/349 |
| 5,988,381 A | * | 11/1999 | Ling ....................... 206/349 |
| 6,241,092 B1 | * | 6/2001 | Vasudeva ................. 206/349 |

* cited by examiner

Primary Examiner—Luan K. Bui

(57) ABSTRACT

A screwdriver hanger has a main plate having a slot, an extended bar extending from the main plate, a plurality of plastics mounts disposed on the extended bar, a plurality of rubber mounts disposed on the extended bar, and a socket disposed on the extended bar. Each of the rubber mounts is disposed between two of the plastics mounts. Each of the plastics mounts has a through aperture. Each of the rubber mounts has a through hole. Each of the plastics mounts is made of a polypropylene material. Each of the rubber mounts is made of a thermoplastic rubber material. A band encloses the socket.

4 Claims, 15 Drawing Sheets

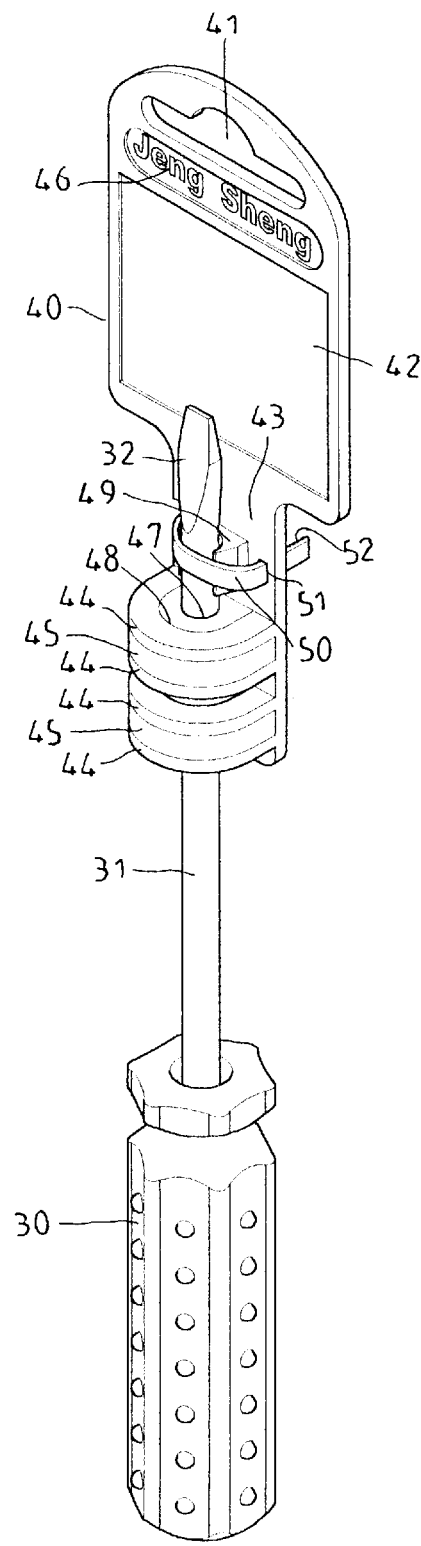
F I G. 3

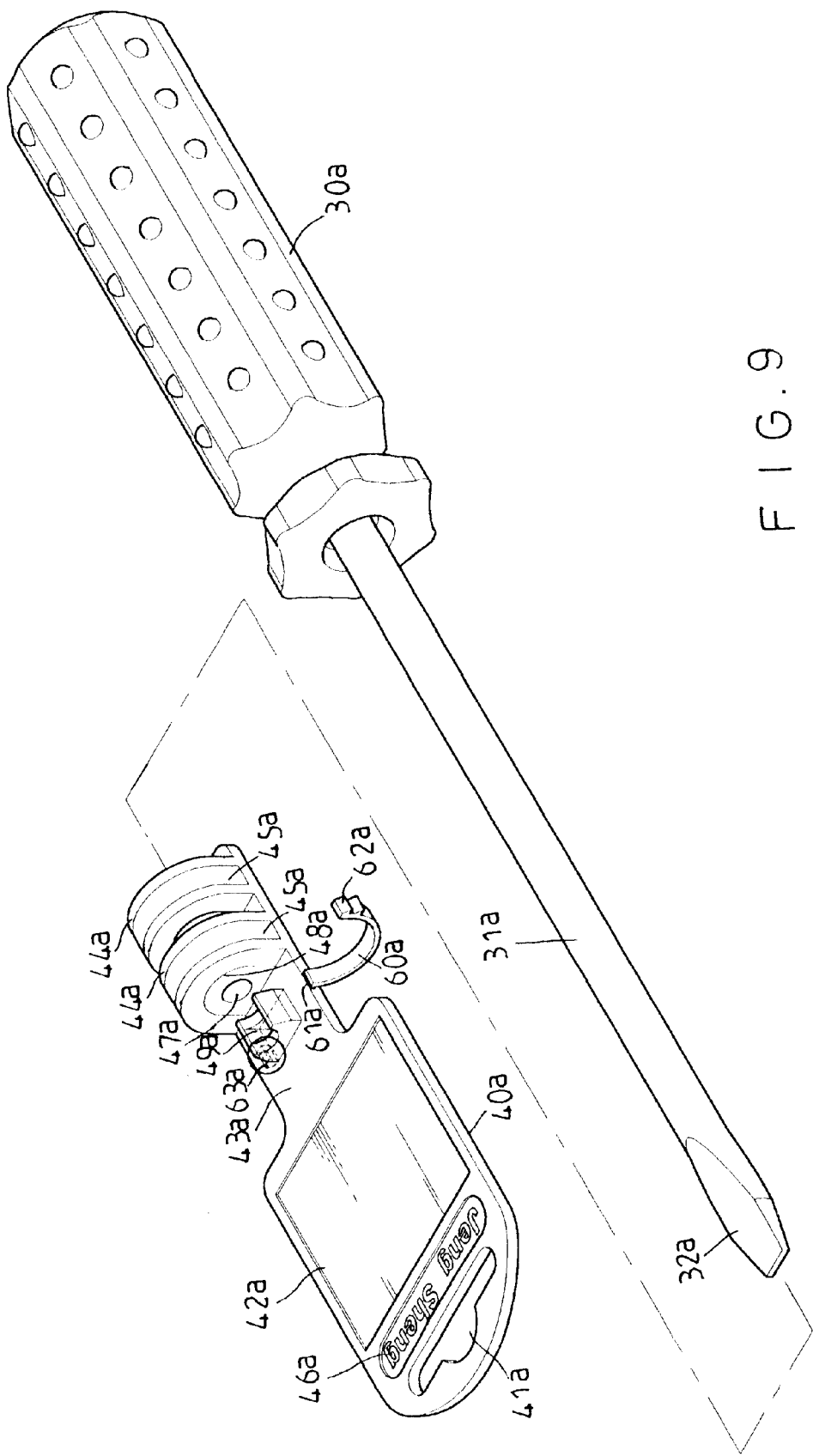

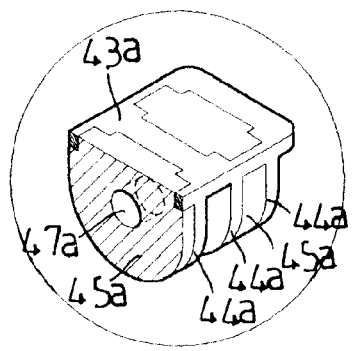
F I G. 9A
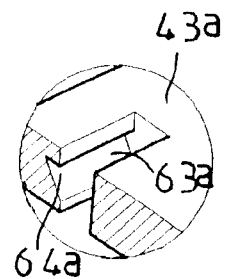
F I G. 9B

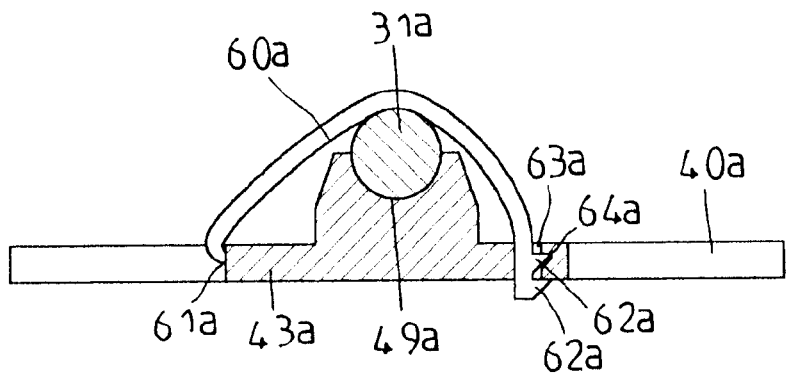
F I G. 10
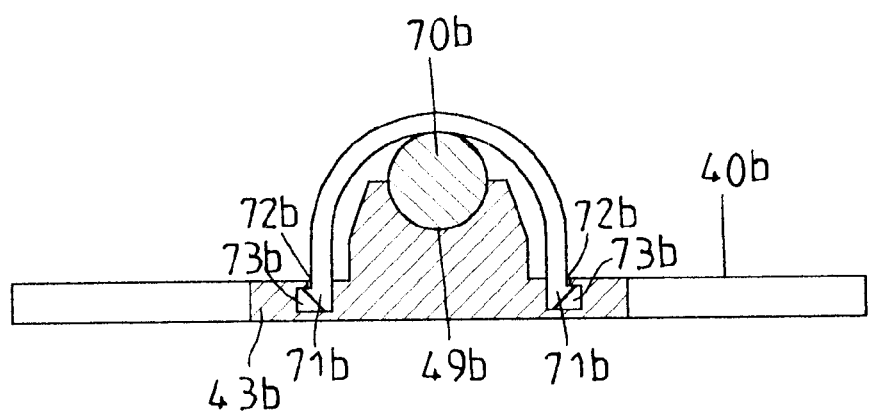
F I G. 12

US 6,425,482 B1

SCREWDRIVER HANGER

BACKGROUND OF THE INVENTION

The present invention relates to a screwdriver hanger. More particularly, the present invention relates to a screwdriver hanger which holds a screwdriver stably.

Referring to FIGS. 1, 1A and 2, a conventional screwdriver hanger has a main plate 10 having a slot 11, an extended bar 13 extending from the main plate 10, and two positioning mounts 14 disposed on the extended bar 13. Two hollow disks 20 each has a through aperture 21. Each of the positioning mounts 14 has a through hole 16 and a bottom groove 15 for receiving one of the hollow disks 20. A sticker 12 is adhered on the main plate 10. A screwdriver 30' has a shank 31' and a tip 32'. The screwdriver 30' is inserted through the positioning mounts 14 and the hollow disks 20. However, it is very easy to pull the screwdriver 30' from the conventional screwdriver hanger.

SUMMARY OF THE INVENTION

An object of the present invention is to provide a screwdriver hanger which holds a screwdriver stably.

Accordingly, a screwdriver hanger comprises a main plate having a slot, an extended bar extending from the main plate, a plurality of plastics mounts disposed on the extended bar, a plurality of rubber mounts disposed on the extended bar, and a socket disposed on the extended bar. Each of the rubber mounts is disposed between two of the plastics mounts. Each of the plastics mounts has a through aperture. Each of the rubber mounts has a through hole. Each of the plastics mounts is made of a polypropylene material. Each of the rubber mounts is made of a thermoplastic rubber material. A band encloses the socket.

BRIEF DESCRIPTION OF THE DRAWINGS

FIG. 3 is a perspective view of a screwdriver hanger of a first preferred embodiment in accordance with the present invention;

FIG. 9 is a perspective exploded view of a screwdriver hanger of a second preferred embodiment in accordance with the present invention;

FIG. 9A is a partially sectional view of a plastics mount and an extended bar of a second preferred embodiment in accordance with the present invention;

FIG. 9B is a partially sectional view of a plastics mount of a second preferred embodiment in accordance with the present invention;

FIG. 10 is a sectional assembly view of a screwdriver hanger of a second preferred embodiment in accordance with the present invention;

FIG. 12 is a sectional assembly view of a screwdriver hanger of a third preferred embodiment in accordance with the present invention.

DETAILED DESCRIPTION OF THE INVENTION

Figure 1:
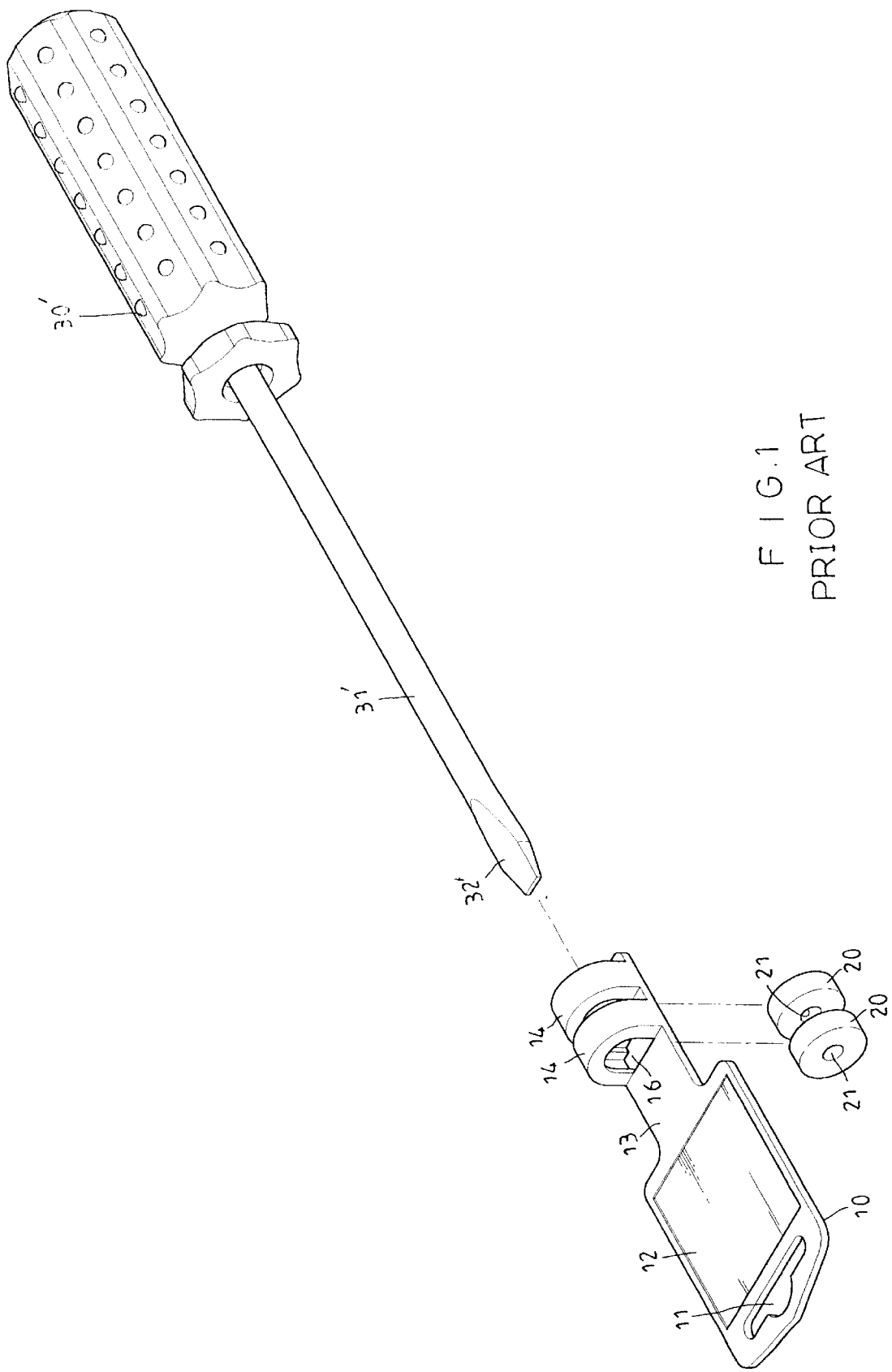
FIGS. 1 and 1A perspective exploded views of a screwdriver hanger of the prior art.
Figure 1A:
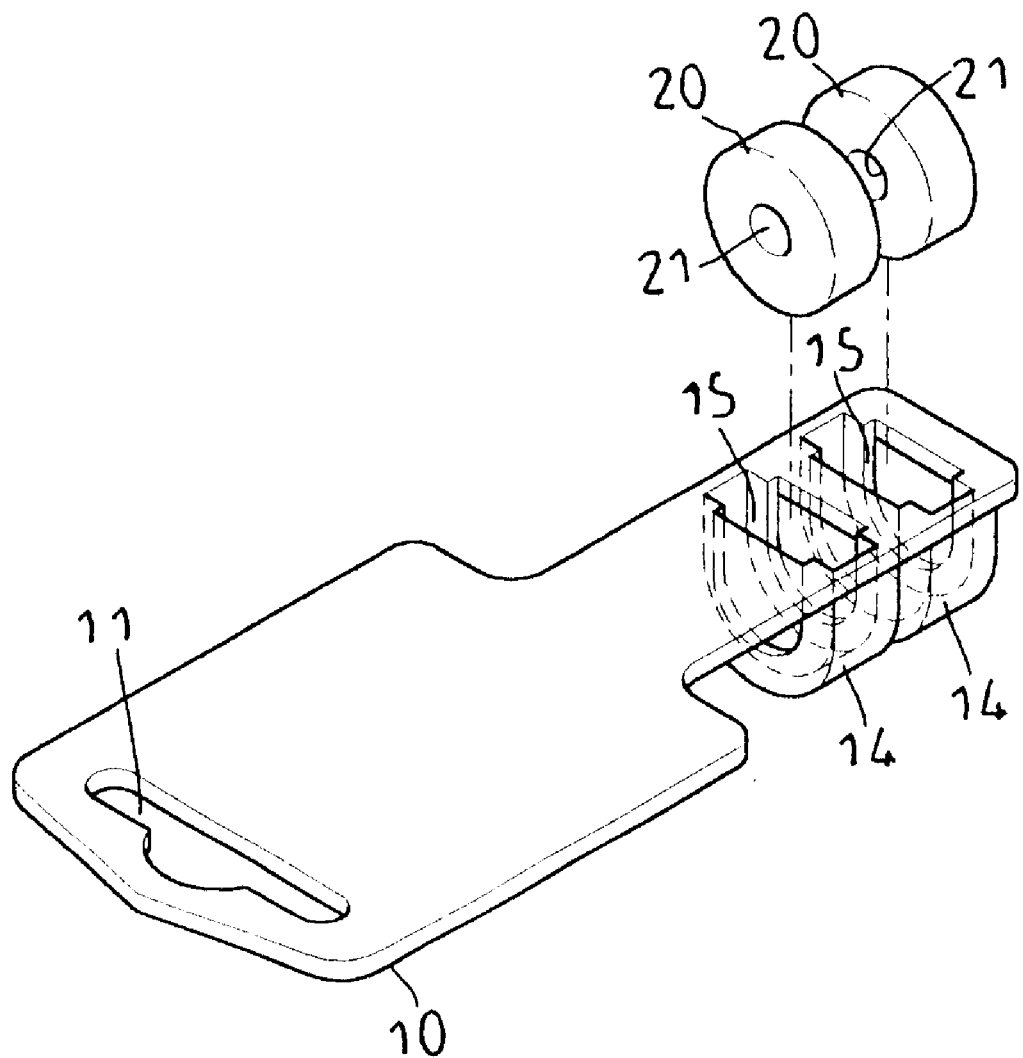
Figure 2:
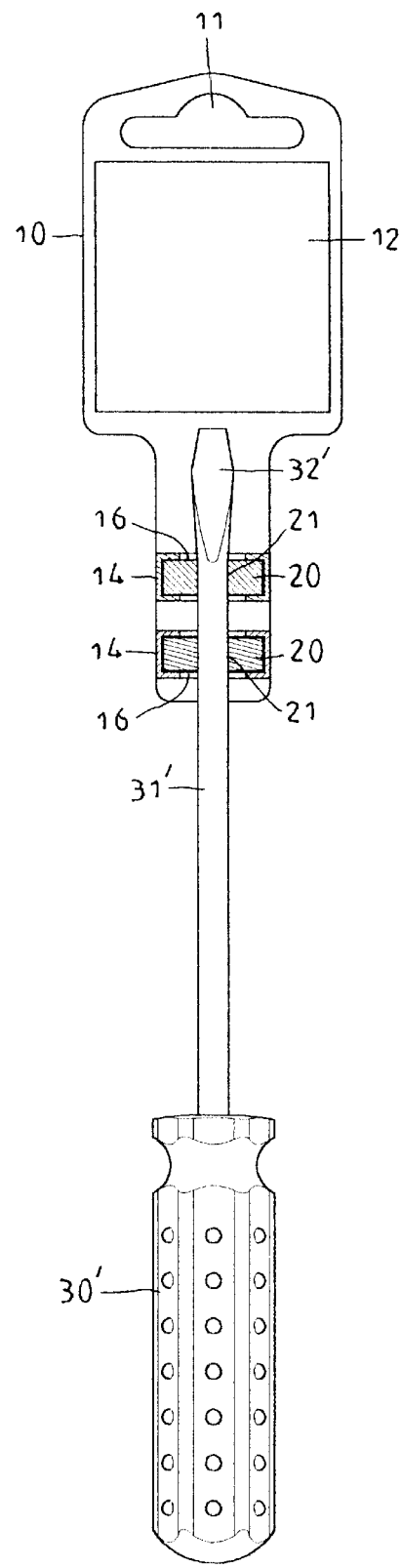
FIG. 2 is an elevational view of a screwdriver hanger of the prior art.
Figure 4:
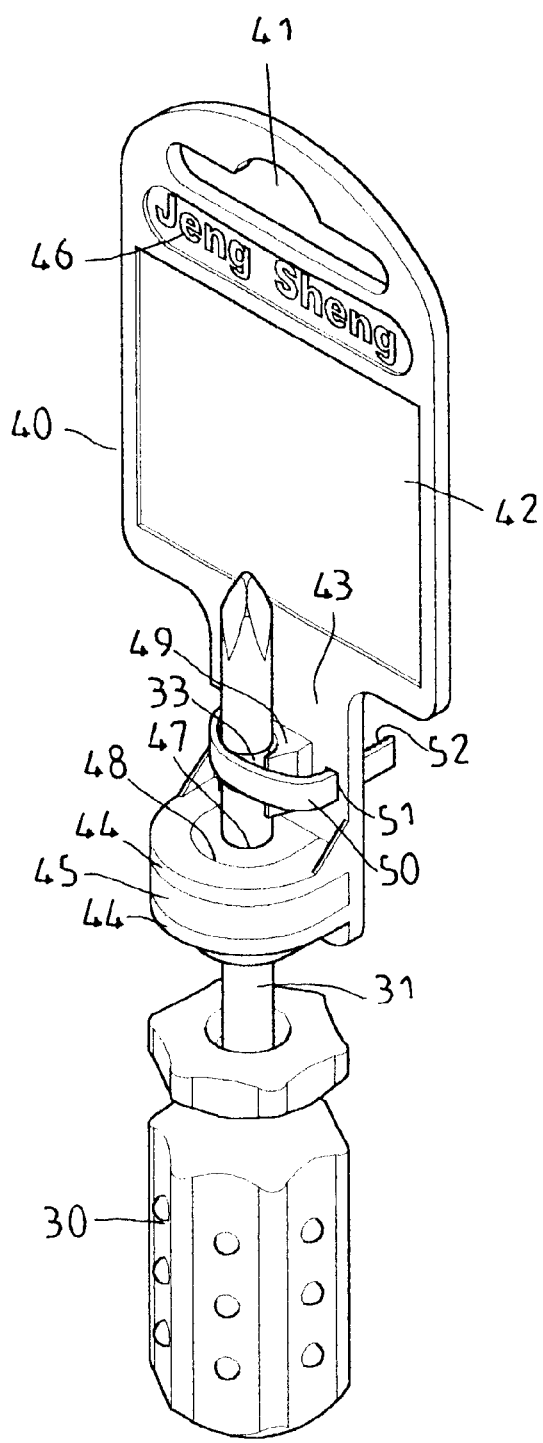
FIG. 4 is another perspective view of a screwdriver hanger of a first preferred embodiment in accordance with the present invention.
Figure 5:
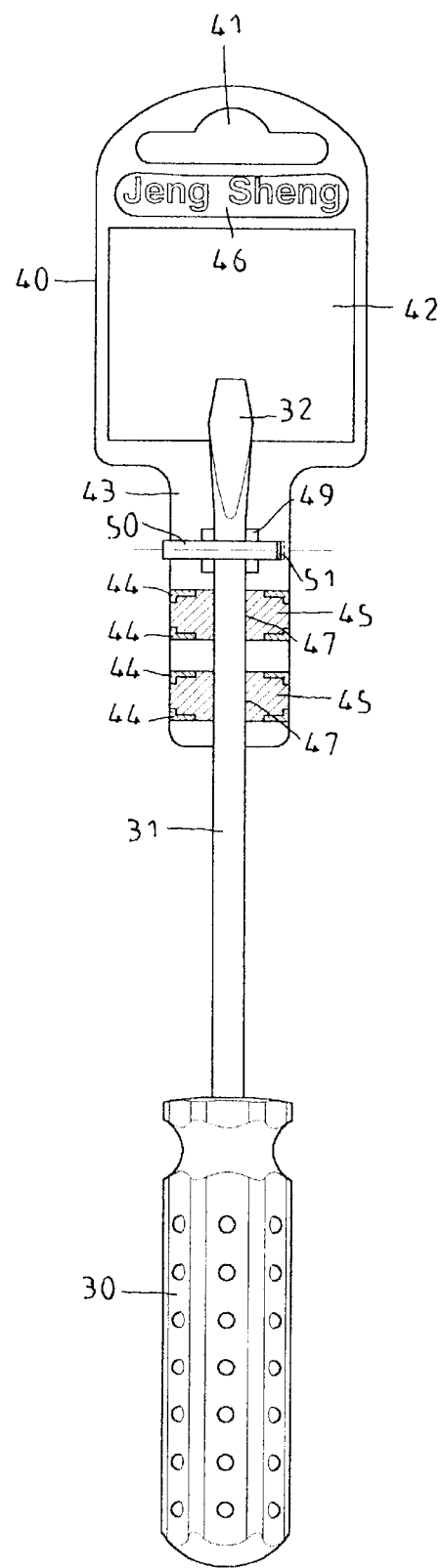
FIG. 5 is an elevational view of a screwdriver hanger of a first preferred embodiment in accordance with the present invention.
Figure 6:
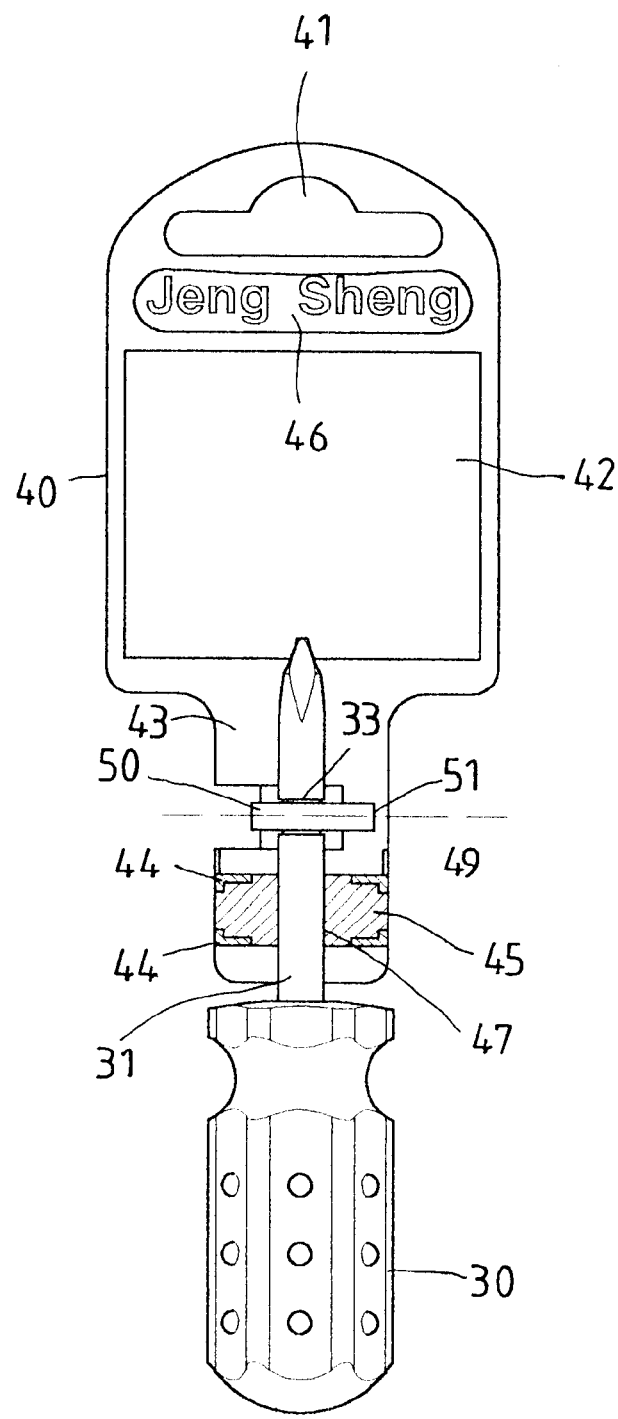
FIG. 6 is another elevational view of a screwdriver hanger of a first preferred embodiment in accordance with the present invention.
Figure 7:
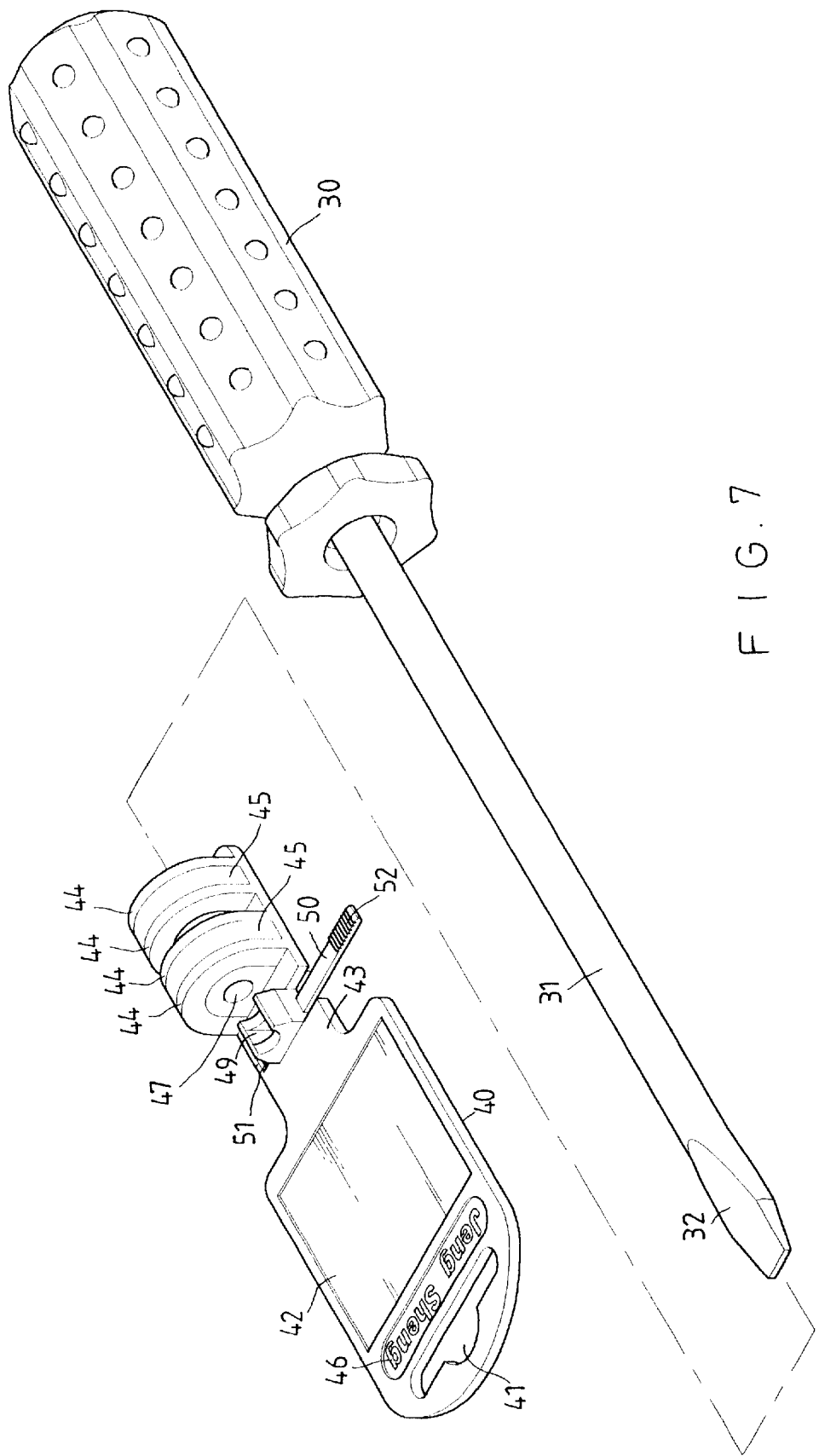
FIG. 7 is a perspective exploded view of a screwdriver hanger of a first preferred embodiment in accordance with the present invention.
Figure 7A:
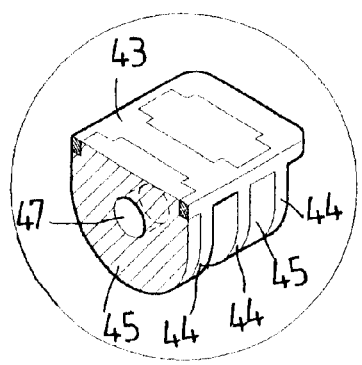
FIG. 7A is a partially sectional view of a plastics mount and an extended bar of a first preferred embodiment in accordance with the present invention.
Figure 7B:
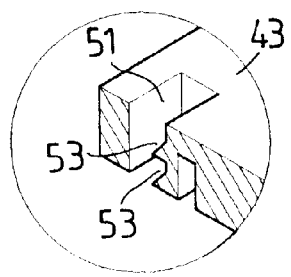
FIG. 7B is a partially sectional view of a plastics mount of a first preferred embodiment in accordance with the present invention.
Figure 8:
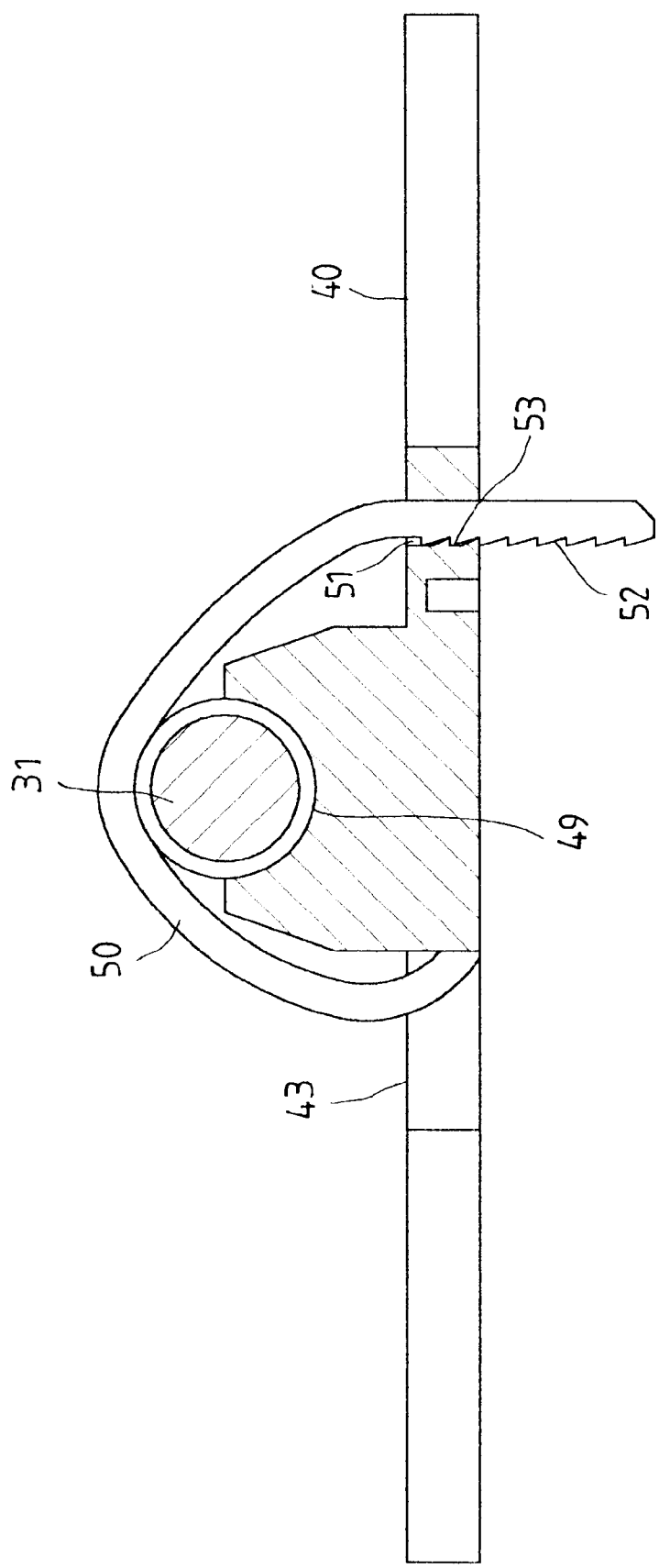
FIG. 8 is a section al assembly view of a screwdriver hanger of a first preferred embodiment in accordance with the present invention.

Referring to FIGS. 1 to 8, a first screwdriver hanger comprises a main plate 40 having a slot 41, an extended bar 43 extending from the main plate 40, a plurality of plastics mounts 44 disposed on the extended bar 43, a plurality of rubber mounts 45 disposed on the extended bar 43, and a socket 49 disposed on the extended bar 43.

Each of the rubber mounts 45 is disposed between two of the plastics mounts 44.

Each of the plastics mounts 44 has a through aperture 47.

Each of the rubber mounts 45 has a through hole 48.

Each of the plastics mounts 44 is made of a polypropylene material.

Each of the rubber mounts 45 is made of a thermoplastic rubber material.

Referring to FIGS. 7 and 8 again, a band 50 is disposed on the socket 49..

The band 50 has a toothed end 52.

The extended bar 43 further has an oblong hole 51 and a plurality of serrated grooves 53 communicating with the oblong hole 51.

The toothed end 52 of the band 50 is inserted through the oblong hole 51 of the extended bar 43.

A sitcker 42 is adhered on the main plate 40.

A screwdriver 30 has a shank 31 and a tip 32. The screwdriver 30 is inserted through the plastics mounts 44, the rubber mounts 45, and the socket 49.

Referring to FIGS. 9 and 10, a second screwdriver hanger comprises a main plate 40a having a slot 41a, an extended bar 43a extending from the main plate 40a, a plurality of plastics mounts 44a disposed on the extended bar 43a, a plurality of rubber mounts 45a disposed on the extended bar 43a, and a socket 49a disposed on the extended bar 43a.

Each of the rubber mounts 45a is disposed between two of the plastics mounts 44a.

Each of the plastics mounts 44a has a through aperture 47a.

Each of the rubber mounts 45a has a through hole 48a.

Each of the plastics mounts 44a is made of a polypropylene material.

Each of the rubber mounts 45a is made of a thermoplastic rubber material.

A band 60a has a protruded end 62a.

An adhesive 61a adheres the band 60a on the socket 49a.

The extended bar 43a further has an oblong hole 63a and a click groove 64a communicating with the oblong hole 63a.

The protruded end 62a of the band 60a is inserted through the oblong hole 63a of the extended bar 43a.

A sitcker 42a is adhered on the main plate 40a.

A screwdriver 30a has a shank 31a and a tip 32a. The screwdriver 30a is inserted through the plastics mounts 44a, the rubber mounts 45a, and the socket 49a.

Figure 11:
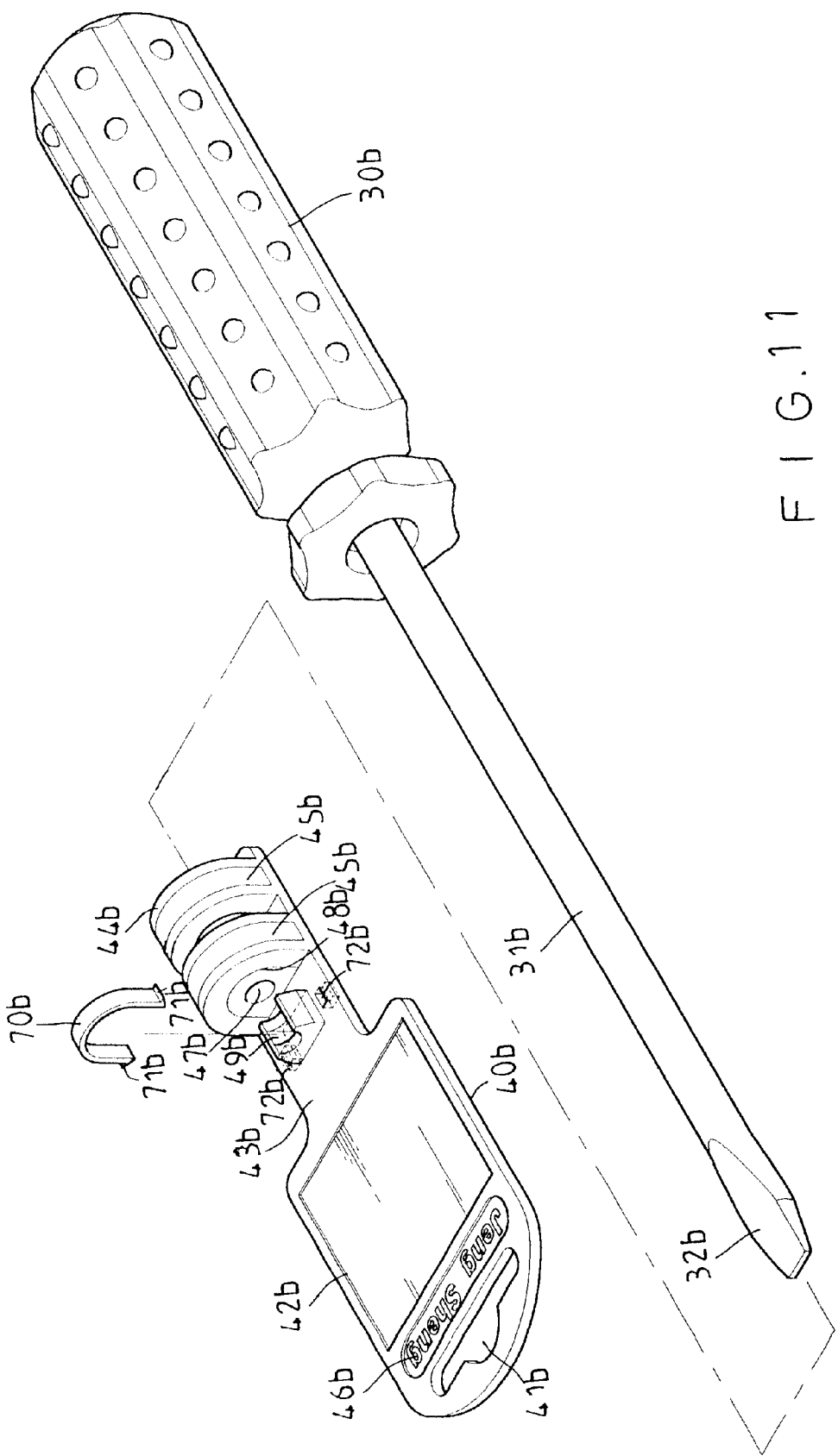
FIG. 11 is a perspective exploded view of a screwdriver hanger of a third preferred embodiment in accordance with the present invention.
Figure 11A:
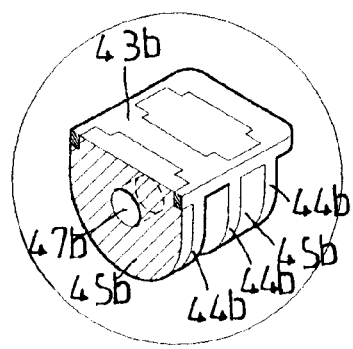
FIG. 11A is a partially sectional view of a plastics mount and an extended bar of a third preferred embodiment in accordance with the present invention.
Figure 11B:
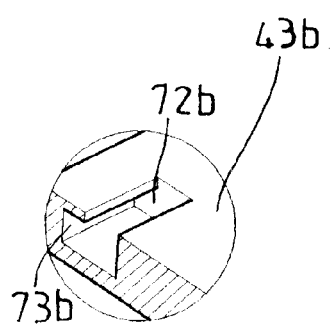
FIG. 11B is a partially sectional view of a plastics mount of a third preferred embodiment in accordance with the present invention.

Referring to FIGS. 11 and 12, a third screwdriver hanger comprises a main plate 40b having a slot 41b, an extended bar 43b extending from the main plate 40b, a plurality of plastics mounts 44b disposed on the extended bar 43b, a plurality of rubber mounts 45b disposed on the extended bar 43b, and a socket 49b disposed on the extended bar 43b.

Each of the rubber mounts 45b is disposed between two of the plastics mounts 44b.

Each of the plastics mounts 44b has a through aperture 47b.

Each of the rubber mounts 45b has a through hole 48b.

Each of the plastics mounts 44b is made of a polypropylene material.

Each of the rubber mounts 45b is made of a thermoplastic rubber material.

A band 70b has two click ends 71b.

The extended bar 43b further has two oblong grooves 72b and two oblong recesses 73b communicating with the oblong grooves 72b.

The click ends 71b of the band 70b are inserted in the oblong groove 72b of the extended bar 43b.

A sitcker 42b is adhered on the main plate 40b.

A screwdriver 30b has a shank 31b and a tip 32b. The screwdriver 30b is inserted through the plastics mounts 44b, the rubber mounts 45b, and the socket 49b.

The invention is not limited to the above embodiment but various modification thereof may be made. Further, various changes in form and detail may be made without departing from the scope of the invention.

I claim:

1. A screwdriver hanger comprises:

a main plate having a slot, an extended bar extending from the main plate, a plurality of plastics mounts disposed on the extended bar, a plurality of rubber mounts disposed on the extended bar, a socket disposed on the extended bar, each of the rubber mounts disposed between two of the plastics mounts, each of the plastics mounts having a through aperture, each of the rubber mounts having a through hole, each of the plastics mounts made of a polypropylene material, each of the rubber mounts made of a thermoplastic rubber material, and a band enclosing the socket.

2. The screwdriver hanger as claimed in claim 1, wherein a band is disposed on the socket, the band has a toothed end, the extended bar further has an oblong hole and a plurality of serrated grooves communicating with the oblong hole, and the toothed end of the band is inserted through the oblong hole of the extended bar.

3. The screwdriver hanger as claimed in claim 1, wherein a band has a protruded end, an adhesive adheres the band on the socket, the extended bar further has an oblong hole and a click groove communicating with the oblong hole, and the protruded end of the band is inserted through the oblong hole of the extended bar.

4. The screwdriver hanger as claimed in claim 1, wherein a band has two click ends, the extended bar further has two oblong grooves, and the click ends of the band are inserted in the oblong groove of the extended bar.

* * * * *